United States Patent
Mazumder et al.

(10) Patent No.: US 9,111,613 B2
(45) Date of Patent: Aug. 18, 2015

(54) ADAPTIVE READING OF A RESISTIVE MEMORY

(71) Applicant: The Regents of The University of Michigan, Ann Arbor, MI (US)

(72) Inventors: Pinaki Mazumder, Ann Arbor, MI (US); Idongesit Ebong, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 73 days.

(21) Appl. No.: 13/939,234

(22) Filed: Jul. 11, 2013

(65) Prior Publication Data

US 2014/0016396 A1    Jan. 16, 2014

Related U.S. Application Data

(60) Provisional application No. 61/670,674, filed on Jul. 12, 2012.

(51) Int. Cl.
*G11C 13/00*    (2006.01)

(52) U.S. Cl.
CPC .......... *G11C 13/004* (2013.01); *G11C 13/0069* (2013.01); *G11C 13/0097* (2013.01)

(58) Field of Classification Search
USPC .................................................. 365/148, 207
See application file for complete search history.

(56) References Cited

U.S. PATENT DOCUMENTS

| | | | |
|---|---|---|---|
| 2005/0099855 A1* | 5/2005 | Holden et al. | 365/200 |
| 2011/0169136 A1 | 7/2011 | Pickett et al. | |
| 2011/0182104 A1 | 7/2011 | Kim et al. | |
| 2011/0182107 A1 | 7/2011 | Wu et al. | |

* cited by examiner

*Primary Examiner* — Hoai V Ho
(74) *Attorney, Agent, or Firm* — Harness, Dickey & Pierce, P.L.C.

(57) ABSTRACT

An adaptive reading and programming method is presented for resistive memory. The core operating principle is to cause a change in the conductance of a resistive memory cell and measure the magnitude of the change. The magnitude of change can be used to determine the logic state of the resistive memory cell. The proposed methods are evaluated in simulation programs with integrated circuit emphasis and a hand analysis model is extracted to help explain the sources of power and energy consumption.

16 Claims, 17 Drawing Sheets

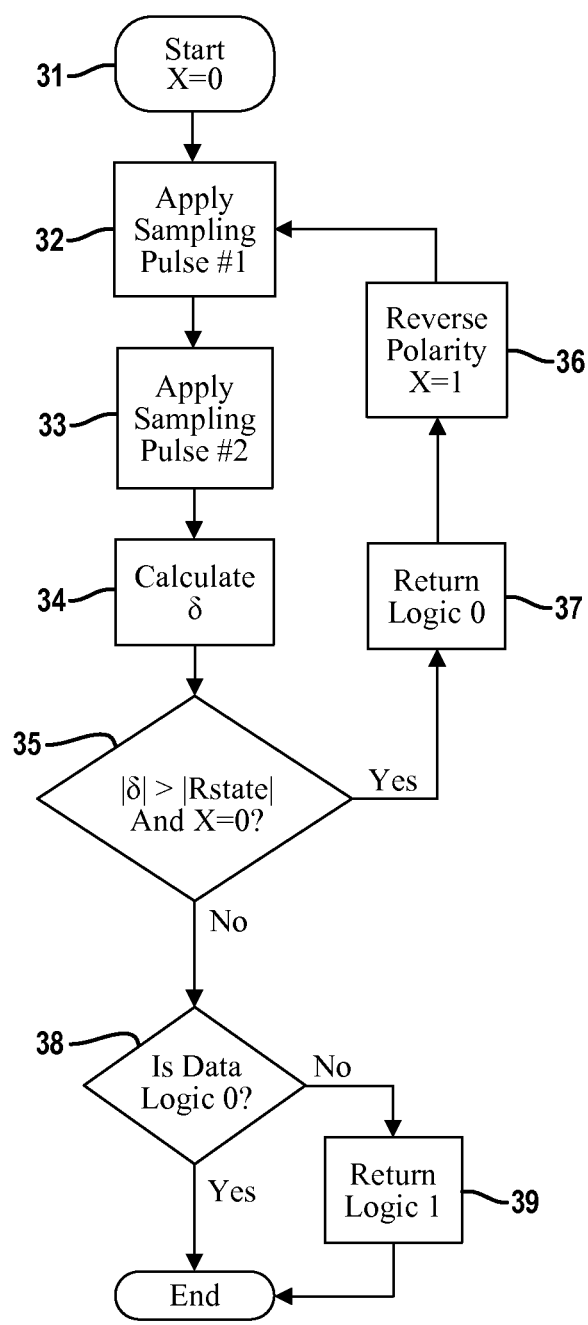
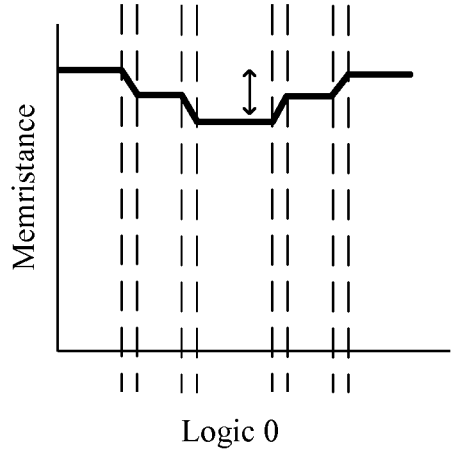
FIG. 3B
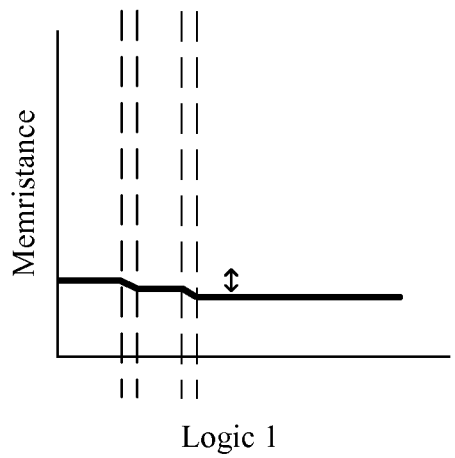
FIG. 3A
FIG. 3C

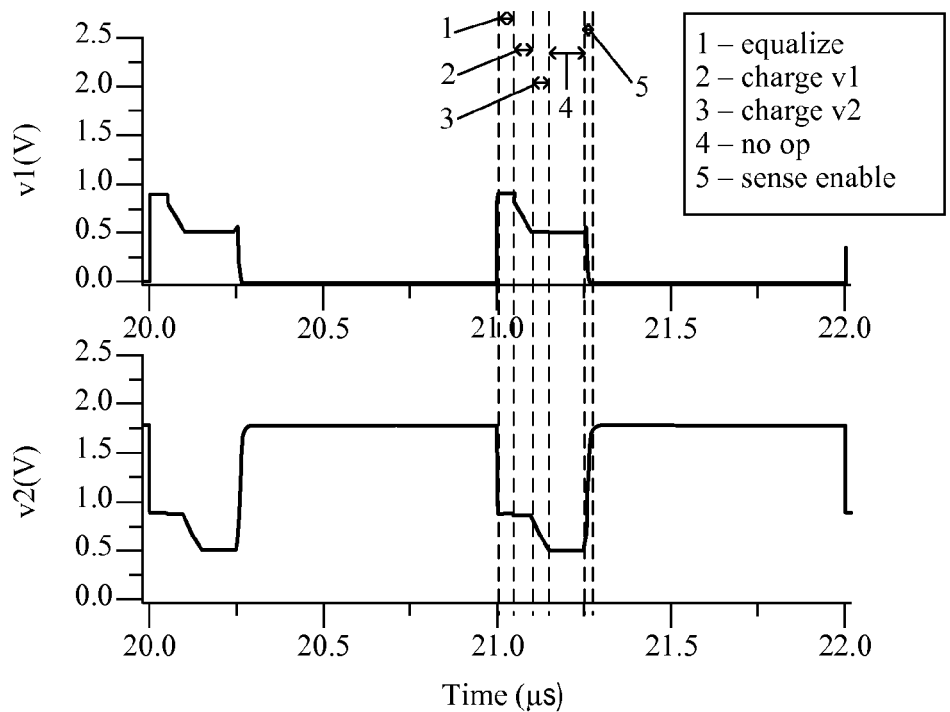
FIG. 6
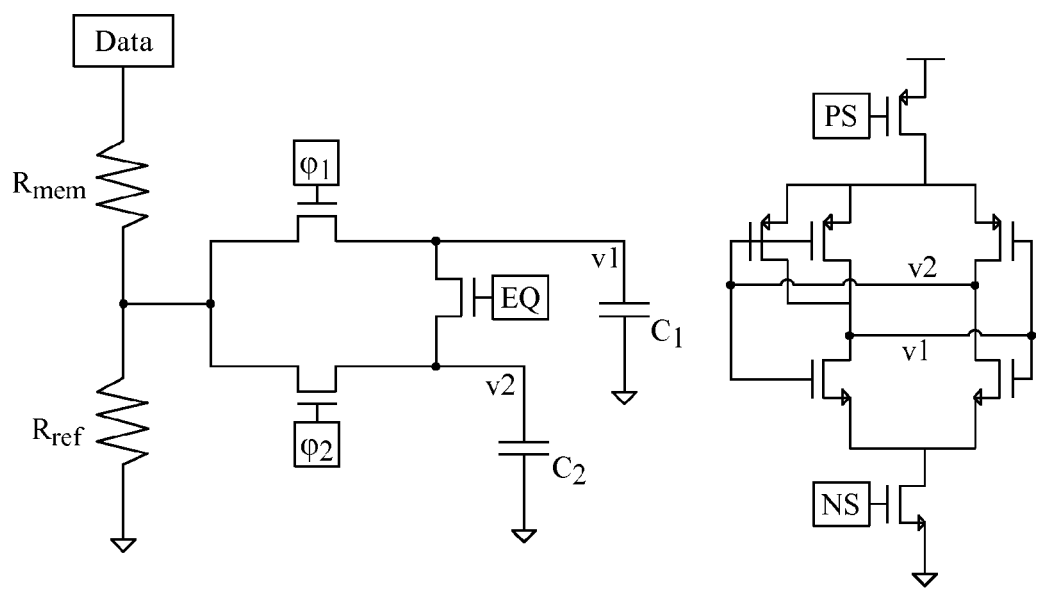
FIG. 7A
FIG. 7B

ADAPTIVE READING OF A RESISTIVE MEMORY

CROSS-REFERENCE TO RELATED APPLICATIONS

This application claims the benefit of U.S. Provisional Application No. 61/670,674, filed on Jul. 12, 2012. The entire disclosure of the above application is incorporated herein by reference.

BACKGROUND

Memory is an indispensable part of electronic devices today. Multiple variants of memory exist and have led to a myriad of niches for multiple memory concoctions. These memory concoctions reside in an ever-changing technological domain allowing for the categorizing of different memory types: volatile versus nonvolatile; fast versus slow; low capacity versus high capacity; and cheap versus expensive. Memory examples include random access memory (RAM), flash, hard drives, and optical disks. Flash memory dominates the nonvolatile memory market today for handheld and battery-operated devices.

Since the identification of a memristor as a resistance based nonvolatile storage element for nanoscale crossbar arrays, multiple applications for the device have been proposed ranging from memory and reconfigurable logic to neuromorphic learning and secure communication. Memristor, in this context, comprises ionic transport devices where electronic charge of ions or other sort of fundamental mechanisms within an insulating material are modulated to change resistance of the device. This current definition should not limit the scope of this disclosure since other forms of resistive memories where successive memory operations can cause incremental resistance changes as described in this disclosure fall within the scope of resistance-based memory cells, what are popularly termed as memristors. From all the applications, the most promising with respect to product development is the digital memory utilizing memristors as storage elements. A new paradigm with respect to memory is necessary for the continued growth in density of nonvolatile memory for anticipated growth in petascale and exascale computing. The memristor's simple structure, small size compared to transistors, and nonvolatility make it a viable candidate for next-generation memory technology. Memristor memory is a subset of resistive memory since logic states are encoded in the memristor's resistance. Even though resistive memory is a more general term, some problems associated with resistive memory in a crossbar array are also characteristic to the memristor memory. The difference between resistive memory and memristor memory lies in the fact that memristors have a pinched hysteresis loop at the origin, while the more general term, resistive, includes devices such as the one in H. S. Majumdar et al's "Memory device applications of a conjugated polymer: Role of space charges", J. Appl. Phys., vol. 91, no. 4, (2009) which do not possess this trait. Resistive memory in essence comprises a lump of devices with differing resistance-change mechanisms. The method introduced in this disclosure, hence, may not be applicable to all resistive memory devices, but it is definitely advantageous to memristor memory systems.

The memristor memory presents a solution to difficulties encountered beyond CMOS scaling, but it also introduces various complications to realizing this memory system. The patent database provides a myriad of methods to deal with difficulties (resistance drift, nonuniform resistance profile across the crossbar array, leaky crossbar devices, etc.) that arise from working with these resistive memory elements. These difficulties (problems) are addressed within the database by using correcting pulses to mitigate effect of resistance drift due to normal usage; using a temperature-compensating circuit to counter resistance drift due to temperature variation; using an adaptive method to read and write to an array with nonuniform resistance profile; and introducing diodes or metal-insulator-metal (MIM) diodes to reduce leaky paths within the crossbar memory array. With every proposed solution to counter a problem, there are drawbacks that need to be considered. This disclosure exposes a view that will lead to the realization of memristor-based memory in the face of low device yield and the aforementioned problems that plague memristor memory.

This section provides background information related to the present disclosure which is not necessarily prior art.

SUMMARY

This section provides a general summary of the disclosure, and is not a comprehensive disclosure of its full scope or all of its features.

An adaptive method is presented for reading a resistive memory. The method includes: applying a first sample pulse of voltage to a terminal of a resistive memory cell and measuring a resistance of the resistive memory cell in response to the first sample pulse; applying a second sample pulse of voltage to the terminal of the resistive memory cell and measuring a resistance of the resistive memory cell in response to the second sample pulse; determining a difference between the first resistance and the second resistance; and determining a logic state of the resistive memory cell from the difference.

In some embodiments, a correction pulse of voltage is applied to the resistive memory cell, where the correction pulse has a polarity opposite the sample pulses. The correction pulse can be applied when the determined logic state corresponds to a high resistance state of the resistive memory cell.

In another aspect of the disclosure, an adaptive method for programming a resistive memory is presented. The method includes: determining a resistive state of a resistive memory cell; applying a first sample pulse of voltage to a terminal of the resistive memory cell and measuring a resistance of the resistive memory cell in response to the first sample pulse; applying a second sample pulse of voltage to the terminal of the resistive memory cell and measuring a second resistance of the resistive memory cell in response to the second sample pulse; determining a difference between the first resistance and the second resistance; and repeating these steps until the difference is less than a threshold. The polarity of the first and second sample pulses can be set in accordance with the determined resistive state of the resistive memory cell.

In some embodiments, the resistive memory cell can be further defined as a memristor. The resistive memory cell can also be arranged in a crossbar memory structure.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 3A-3C are diagrams illustrating a read operation for a resistive memory cell;

FIG. 6 is a graph depicting the different tasks associated with the read operation;

FIGS. 7A and 7B are schematics of example sampling circuit and sense circuit, respectively;

FIG. 12 depicts results for the change in unselected devices during an erase operation;

DETAILED DESCRIPTION

Figure 1:
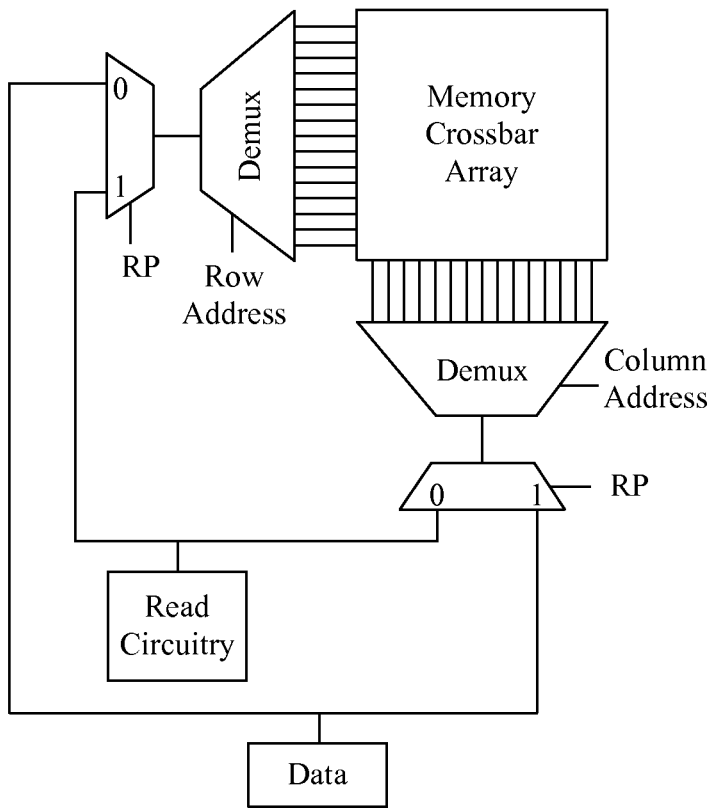
FIG. 1 is a block diagram of an example arrangement for a memory crossbar array and its periphery circuitry.

An adaptive method for reading and writing to a resistive memory is set forth below. Resistive memory is a general term that encompasses memristor memory as well as other memory devices where logic states are encoded in a resistive element. While reference is made throughout the description to memristor, it is readily understood that the methods set forth below are applicable more generally to resistive memory.

For illustrations purposes, the memristor model used for simulation is based on the nonlinear drift model with the window function $F_p(2)$ as defined by Y. N. Joglekar et al in "The elusive memristor: Properties of basic electric circuits", Eur. J. Phys., vol. 30, no. 4 (July 2009). The doped-region width w is modulated according to equation (1) below with the window-function definition expressed in equations (2). For the SPICE simulation, the memristor model was implemented as a functional block in Verilog-A with parameter p=4, memristor with D=10 nm, and dopant mobility $$\mu_D = \frac{10^{-9} \text{ cm}^2}{V \cdot s}:$$

$$\frac{dw}{dt} = \frac{\mu_D R_{ON}}{D} i(t) F\left(\frac{w}{D}\right) \tag{1}$$

$$F_p(x) = 1 - (2x - 1)^{2p}. \tag{2}$$

Diodes are used for crossbar isolation of individual devices in accordance with D. Rinerson, et al's "Re-writable memory with non-linear memory element", U.S. Pat. No. 6,870,755, Unity Semiconductor Corporation, Sunnyvale, Calif. (2005). For simulation, the memristor is in series with a bidirectional diode model, representative of the MIM diode, presented as $$I_{Diode} = I_0(e^{qV_D/nkT} - 1). \tag{3}$$

Overall, the simulation parameters for the diodes were: $I_0$=2.2 fA, kT/q=25.85 mV, $V_D$ is dependent on applied bias, and n=1.08. A P-N diode model is used because it provides a weaker isolation than actual MIM diodes. Hence, if the proposed adaptive method works with the P-N diode configuration, then it will work better with the actual MIM configuration that depends on tunneling currents and provides better isolation than P-N diodes. This disclosure does not limit isolating devices to diodes only. Transistor-less nonvolatile resistive memory cell with isolating diodes described in this disclosure is known as 1D1R cell configuration. This configuration has been used as an example to describe the invention. However, a crossbar memory array with a cross-point access transistor along with a non-volatile resistive element can also be used for this invention. This cell structure is known as 1T1R configuration since it is similar to 1T1C structure of a DRAM cell.

Nanowire modeling for simulation is a distributed pi-model, but for hand calculations, a lumped model is used. From G. S. Snider et al's "Nano/CMOS architectures using a field-programmable nanowire interconnect", Nanotechnology, vol. 18, no. 3 (2007), nanowire resistivity follows:

$$\frac{\rho}{\rho_0} = 1 + 0.75 \times (1 - p)\left(\frac{\lambda}{d}\right) \tag{4}$$

where $\rho_0$ is the bulk resistivity, d is the nanowire width, and $\lambda$ is the mean free path. The nanowire-recorded value used for the simulation was: 24µΩ·cm for 4.5-nm thick Cu. Following a conservative estimate, the nanowire resistance was chosen to be 24 kΩ in total. Using a nanowire capacitance of 2.0 pF·cm$^{-1}$, the nanowire modeling was made transient complete. While an exemplary embodiment has been described above with specific values and arranged in a specific configuration, it will be appreciated that the memristor may be modeled and thus constructed with many different configurations and/or values as necessary or desired for a particular application. The above configurations and values are presented only to describe one particular embodiment that has proven effective and should be viewed as illustrating, rather than limiting, the present invention.

FIG. 1 shows a top-level block diagram and the connections between a memory crossbar array and the periphery circuitry. The arrangement includes a memory crossbar array 11, a row addressing multiplexer 12 along with a corresponding signaling multiplexer 13, a column addressing multiplexer 14 along with a corresponding signaling multiplexer 15, read circuitry 16 and a data section 17. The row- and column-address signals allow a selected row or column to be transparent to either the read circuitry or the data sections.

The nature of the multiplexers may prove to make design more difficult due to the stringent requirements of their functionality. These requirements do not affect the muxes controlled by the reverse polarity (RP) signal; these muxes are simpler since they are essentially transmission gate muxes that switch between two paths. For the row- and column-address muxes, the mux requirements extend beyond switching paths for unselected and selected lines. Preliminary simulations propose active bias for unselected lines (columns and/or rows). When a line is unselected, a reference bias must be set on all the unselected lines thereby limiting the leakage paths that may affect read and write integrity. For more details on this problem, refer to G. Csaba et al's "Read-out design rules for molecular crossbar architectures", IEEE Trans. Nanotechnol., vol. 8, no. 3 (2009), where the authors discussed in detail the effect on noise margin of floating the unselected lines in a resistive memory.

In this implementation, the selected and unselected lines have two different references corresponding to when the memory is in use and when the memory is not in use. When in use, the unselected lines are held at $V_{REF}$ voltage, while when not in use, the lines are grounded. The selected lines pulsate between $V_{REF}$ and $V_{DD}$ when memory is in use but is held to ground when memory is not in use. The signal flow is unidirectional from data section 17, through a signaling mux, through an addressing mux/demux, through the memory crossbar array 11, through another addressing mux/demux, then another signaling mux, and finally to the read circuitry 16. The signal-flow direction is controlled by which signaling mux is connected to the read circuitry 16 and by which signaling mux is connected to data section 17.

Data section 17 is a small driver that asserts $V_{DD}$. The length of time $V_{DD}$ is asserted is controlled by timing circuits that determine when to open the signal path from the data section 17 to read circuitry 16. The read circuitry 16 is essentially a generic block that implements the flow diagrams presented below in FIGS. 3A, 4A and 5A. This signal flow is used to avoid negative-pulse-generation signals as seen in Y. HO et al's "nonvolatile memristor memory: Device characteristics and design implications", Proc. Int. Conf. Computer-Aided Design (2009) and D. Niu et al's "Low-power dual-element memristor based memory design, in Proc. Int. Symp. Low Power Electron Design (2010).

Figure 2:
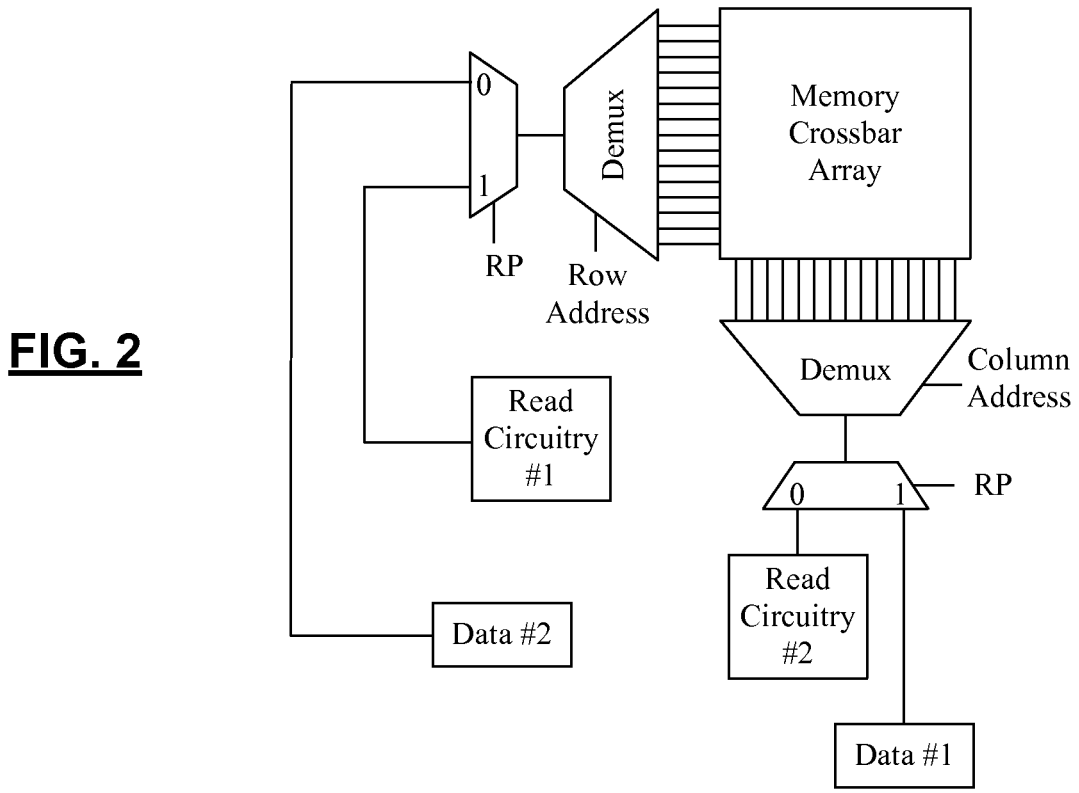
FIG. 2 is a block diagram of an alternative arrangement for a memory crossbar array and its periphery circuitry.

FIG. 2 illustrates an alternative embodiment for the memory crossbar array arrangement. In this arrangement, multiple read circuits 16A, 16B and data drivers 17A, 17B are used in order to minimize feedthrough from isolated paths in the muxes. By creating isolation, only one of the data drivers as well as only one read circuit is active at a given time; otherwise, this arrangement functions in the manner described above.

FIG. 3A depicts an adaptive method for reading a resistive memory. The method begins by applying a bias voltage to the resistive memory in order to sample its present value. In particular, a sample pulse is applied as indicated at 32 and the resistance of the memory cell is measured in response to the sample pulse. A second sample pulse is then applied as indicated at 33 and the resistance of the memory cell is again measured in response to the sample pulse. The magnitude of the pulses is chosen in a manner that will change the conductance of the resistive memory cell. A difference is calculated at 34 between the first resistance measure and the second resistance measure. The difference signifies the amount of change that has occurred with the memory cell between the two sample pulses and can be used to determine the logic state of the memory cell.

Depending on the magnitude of the difference, the read circuitry will return either a "Logic 0" or a "Logic 1." The definitions of both the "Logic 0" and "Logic 1" states depend on the designer. In one state, the sampling pulses push against an upper (lower) limit, while in the other state, the sampling pulses move the memristor in a direction opposite its current state. For illustration purposes, Logic 0 corresponds to a high resistive state as shown in FIG. 3B; whereas, Logic 1 corresponds to a low resistive state as shown in FIG. 3C. The change in the resistive state caused by the sampling pulses will be larger in a memory cell in a high resistive state than one in a low resistive state as shown in the figures. By comparing the difference to a threshold, the logic state of the memory cell can be determined as indicated at 35. It is understood that the correspondence between logic states and resistive states could be reversed.

The read method is preferably designed to prevent or minimize read disturbance to the memory cells. Since each memory device in the crossbar array is different, the pulses utilized for the read may cause destructive reads thereby requiring a data refresh after read. In the example embodiment, a refresh process is built into the read method. In particular, a correction pulse is applied at 37 to the resistive memory cell, the correction pulse has a polarity opposite the sample pulses. In this way, the resistive state of the memory cell returns to its initial value as shown in FIG. 3B. This correction is only needed when the logic state corresponds to a high resistance state. In addition, a flag is set (i.e., X=1) so that processing drops out of the processing loop. Lastly, the appropriate logic state is returned by the read circuitry 16.

In an alternative approach, the logic state may be determined from the slope between the first resistance measure and the second resistance measure (i.e., the rate of change in the resistance). For example, a memory cell in a high resistive state will have a larger slope than one in a low resistive state. By computing the slope and comparing to a threshold, the logic state of the memory cell can be determined.

Figure 4A:
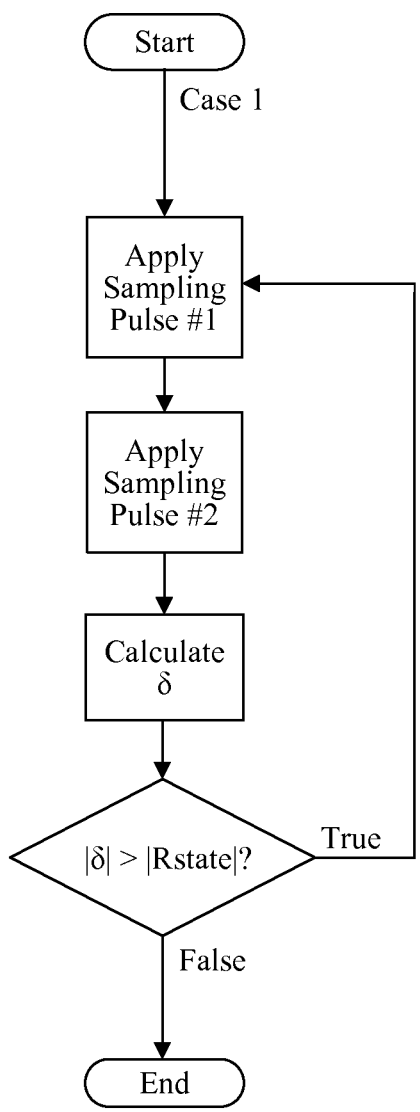
FIGS. 4A-4C are diagrams illustrating a write operation for a resistive memory cell.
Figure 5A:
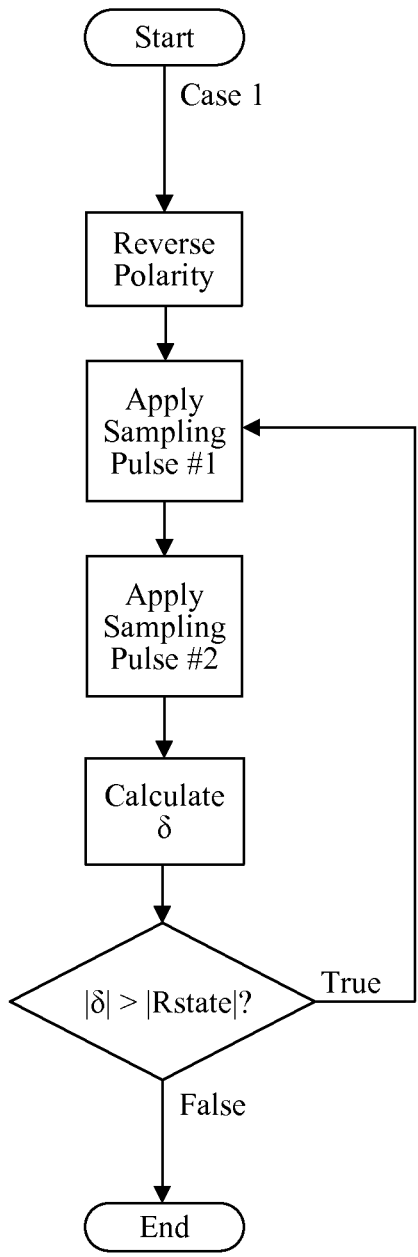
FIGS. 5A-5C are diagrams illustrating an erase operation for a resistive memory cell.

FIGS. 4A and 5A depict an adaptive method for writing and erasing a resistive memory, respectively. Either method begins by determining the logic state (i.e., resistive state) of the memory cell. The write operation is defined as taking the memristor from a "Logic 0" to a Logic 1," while the erase operation changes the memristor from a "Logic 1" to a "Logic 0." These states can be interchanged depending on definition, as long as the definition is consistent across the read, write, and erase operations. In these examples, the read method has been extended to set the logic state of the memory cell. The goal is to reuse circuitry from the read operation for the erase and write operations.

Figure 4B:
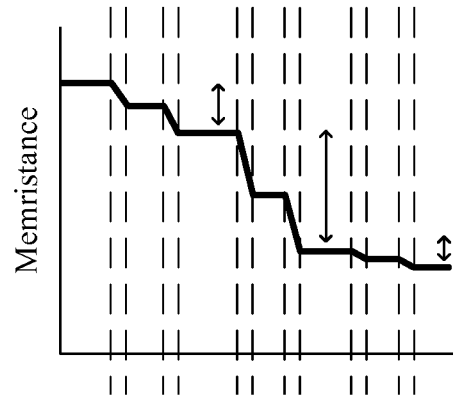
Figure 4C:
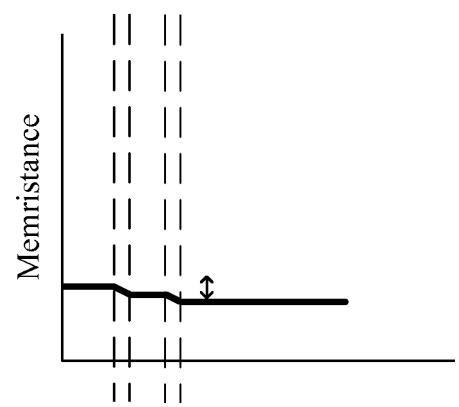

The write operation is further described in relation to FIG. 4A-4C. A first sample pulse of voltage is applied at 41 to a terminal of the resistive memory cell and the resistance of the memory cell is measured in response to the first sample pulse. A second sample pulse of voltage is applied at 42 to the terminal of the resistive memory cell. It is noted that the magnitude of the voltage applied during the write/erase operation is substantially the same magnitude as the voltage applied during a read operation. A difference between the first resistance measure and the second resistance measure is computed at 43. When the difference exceeds a threshold, the process is repeated as indicated at 44. The process continues to be repeated until the difference is less than the threshold, thereby driving the resistance to the low resistance state as shown in FIG. 4B. When the write operation is applied to a memory cell in a low resistance state, a few (if any) cycles are needed to program the cell as shown in FIG. 4C.

Figure 5B:
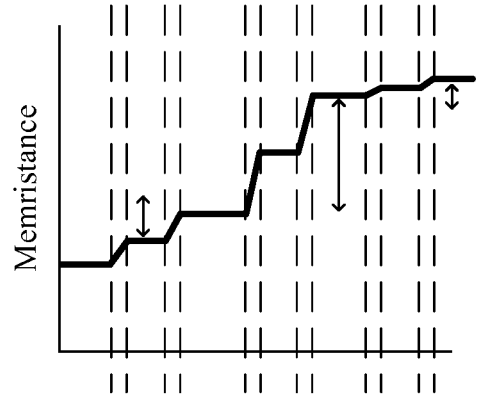
Figure 5C:
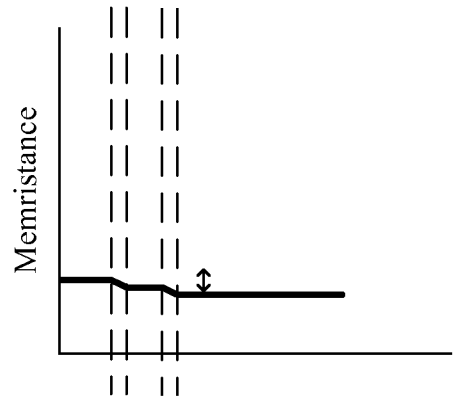

On the other hand, the erase operation is further described in relation to FIG. 5A-5C. In this case, polarity of the voltage pulses is opposite of that in the write operation and is set accordingly at 51. A first sample pulse of voltage is applied at 52 to a terminal of the resistive memory cell and the resistance of the memory cell is measured in response to the first sample pulse. A second sample pulse of voltage is applied at 53 to the terminal of the resistive memory cell. A difference between the first resistance measure and the second resistance measure is computed at 54. When the difference exceeds a threshold, the process is repeated as indicated at 55. The process continues to be repeated until the difference is less than the threshold, thereby driving the resistance to the high resistance state as shown in FIG. 5B. When the erase operation is applied to a memory cell already near a high resistance state, a few (if any) cycles are needed to program the cell as shown in FIG. 5C.

The advantages of reading, writing, and erasing using the methods described above includes: tolerance to crossbar-variation resistance; adaptive method to write and erase a crossbar memory; and circuitry reuse for read, write, and erase. The evaluation of the method in the following sections will strive to provide evidence of these assertions. Before diving into the evidence, a circuit model for implementing these methods is presented.

FIG. 6 shows the different tasks (equalize, charge v1, charge v2, no op, and sense enable) that compose a read. The circuit that produces these signals is shown in FIGS. 7A and 7B. Two sampling signals, i.e., $\phi_1$ and $\phi_2$, control the conversion of current-to-voltage samples on capacitors $C_1$ and $C_2$. But before any sampling, an equalize operation is performed to balance the charges on both capacitors by asserting EQ signal high. Once the signals are sampled, then the sense-enabled operation is performed by first asserting NS high and, then, later PS high. It is readily understood that other circuit configurations for the sense circuit and the amplifier circuit fall within the broader aspects of this disclosure.

The sense amplifier in FIG. 7A is modified from conventional sense amplifiers. Specifically, the amplifier is purposefully made unbalanced to produce a default output of low resistance. The unbalanced attribute of the sense amplifier can be achieved in multiple ways, but an example method is to make the W/L ratio of both $M_{pa}$ and $M_{pb}$ 320 nm/180 nm; the W/L ratio of $M_{na}$ 1 μm/500 nm; and W/L ratio of $M_{nb}$ 1.2 μm/500 nm. The NMOS devices are unbalanced, while the PMOS devices are balanced. The transistor controlled by NS has a ratio of 280 nm/180 nm, while the one controlled by PS has 400 nm/180 nm. $R_{ref}$ is an 80-kΩ resistor, while $R_{mem}$'s default value is expected to vary from 20 kΩ to 20 MΩ. Other techniques for unbalancing the amplifier are also contemplated by this disclosure.

The simulation approach consists of considering different memory conditions on a 16×16 array. The device of interest is situated in the center of the array, but all verifications were done with a worst-case device at the corner with minor changes in the results. The crossbar array unless specified otherwise contains all memristors with the ability to change states.

In high-state simulation (HSS), the memristor crossbar array has all devices initialized to a high conductive state (the worst-case scenario). The device of interest to be written to has a resistive range between 20 kΩ and 20 MΩ, and its initial resistance is ~18 MΩ. The device accessed for the write operation is located at the center of the array (eighth row, eighth column).

Figure 8A:
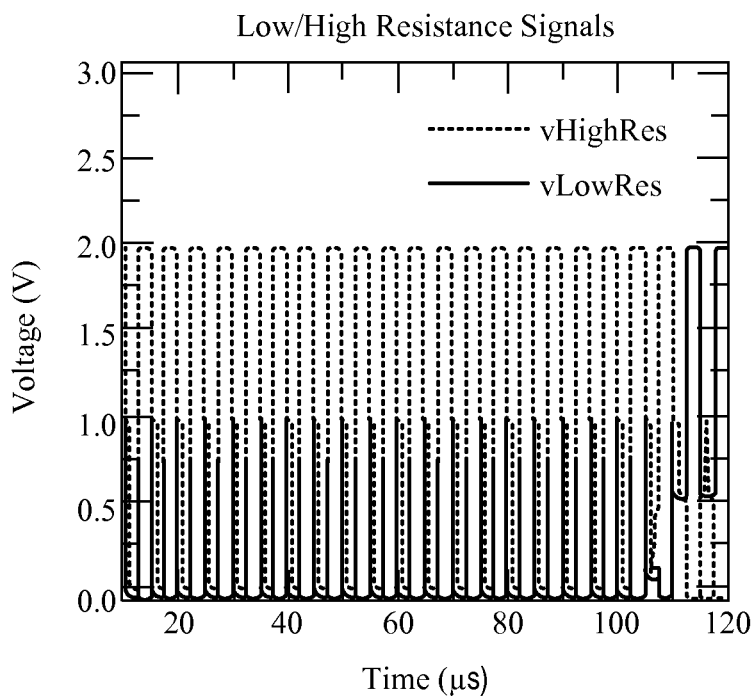
FIGS. 8A and 8B are diagrams illustrating simulation results for writing to an RRAM cell.
Figure 8B:
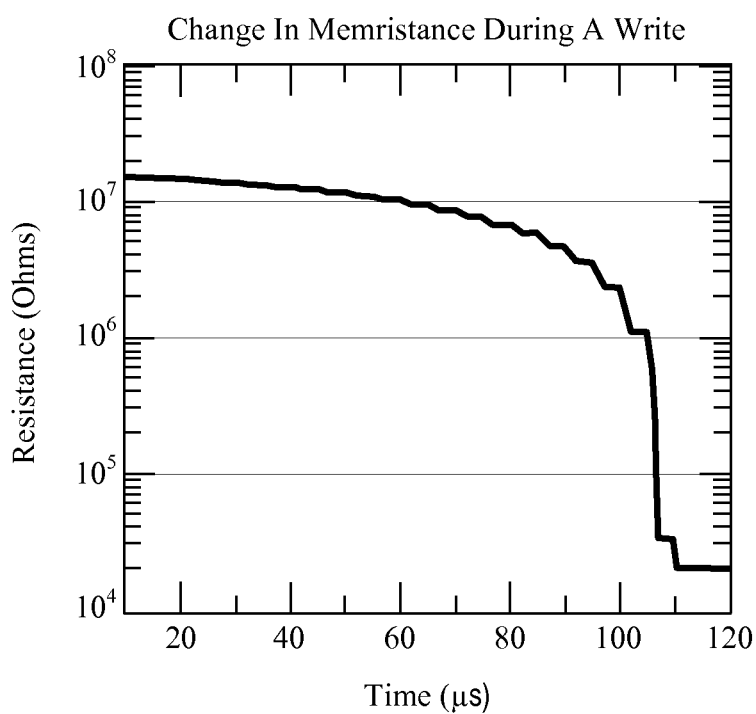

FIG. 8A shows the number of cycles required for a write, while FIG. 8B shows the change in memristance of the accessed device in each read cycle. Each read operation provides the device-state feedback, and the device only changes from high resistance to low resistance when the device is written to its lowest resistance level, i.e., 20 kΩ. The number of read cycles necessary to write in this case is ~21. The signals v1 and v2 presented in FIGS. 6 and 7 are appropriately renamed to help facilitate the understanding of the simulation results. "vHighRes" and "vLowRes" are the logically renamed signals to denote when the device of interest is in a high-resistance state and a low-resistance state. When the signal vHighRes is high, the memristor is in a high-resistance state, but when vLowRes is high, the memristor is in a low-resistance state. Both vHighRes and vLowRes are always opposite of each other in the sense-enable phase.

Figure 9A:
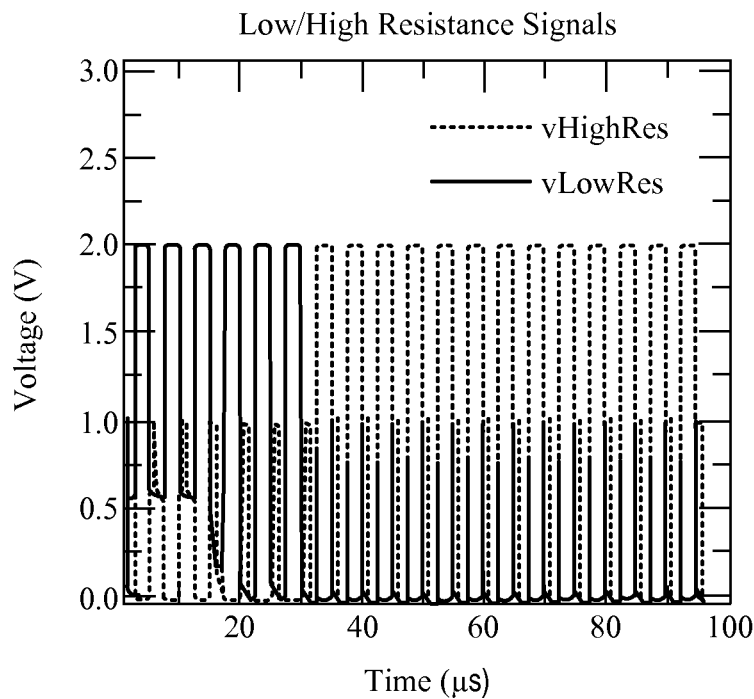
FIGS. 9A and 9B are diagrams illustrating simulation results for erasing an RRAM cell.
Figure 9B:
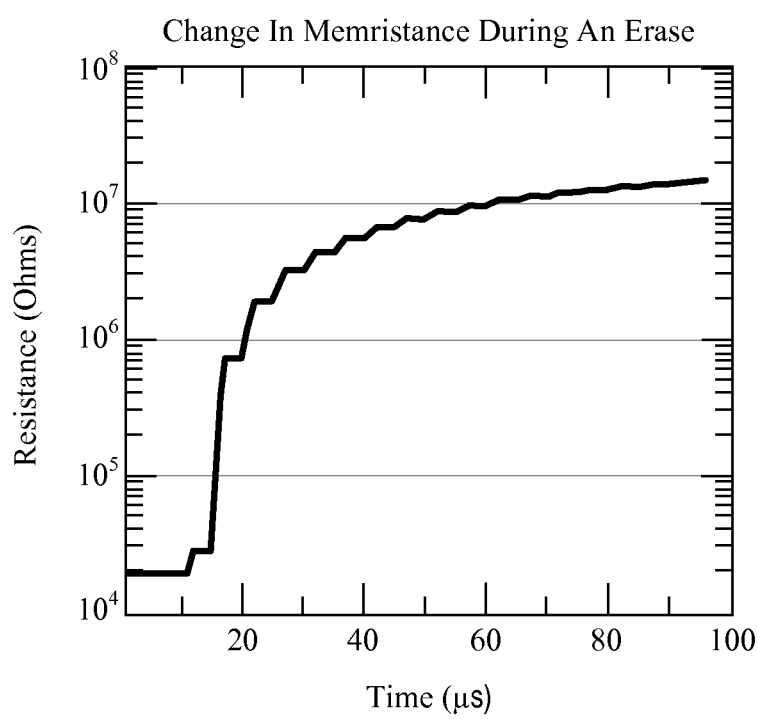

FIG. 9A shows the number of cycles required for an erase, while FIG. 9B shows the change in memristance of the accessed device. Just like the write cycle, the erase cycle is performed through read operations. The erase cycle takes six read cycles to go from a low-resistive state to a high-resistive state. The sense amplifier recognizes the switch to a high-resistive state when the resistance is about 4.21 MΩ. This implies that during memory operation, the number of read operations necessary for a write after an erase may be different. And this adaptive method will prevent any overerasing or overwriting (overprogramming).

Figure 10:
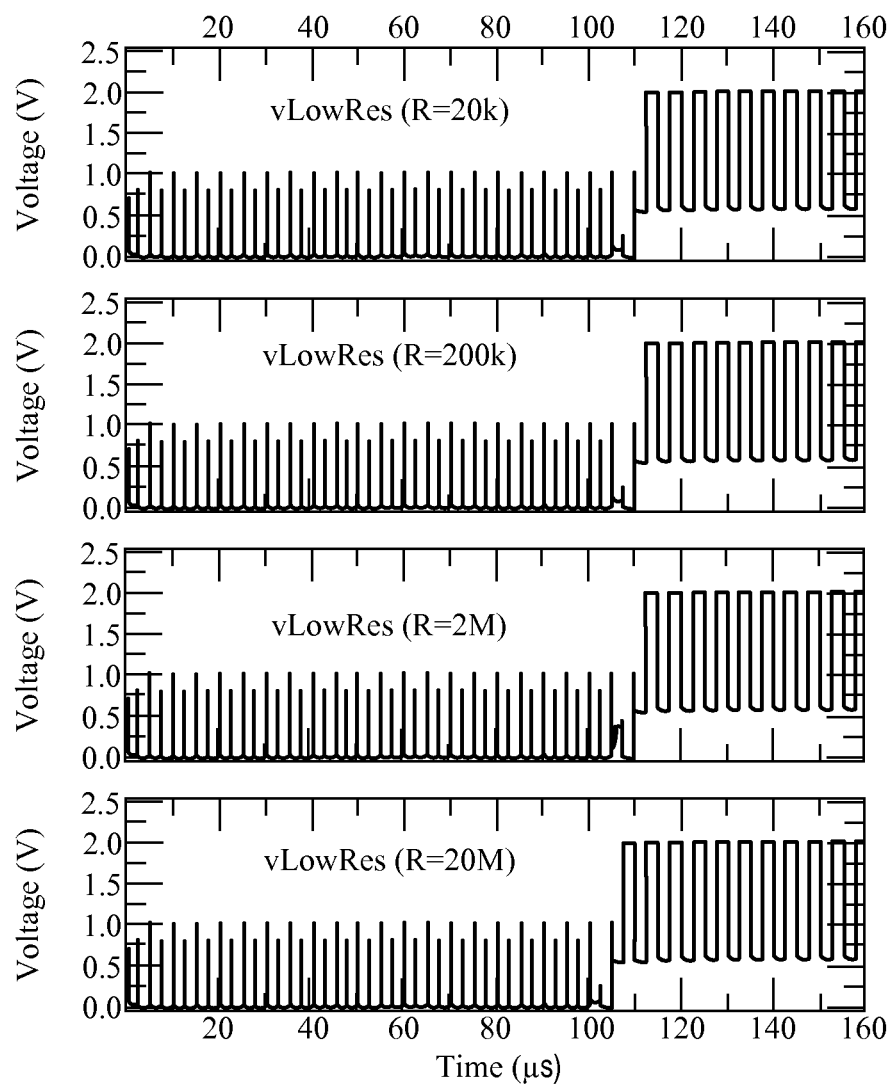
FIG. 10 is diagram illustrating simulation results for writing in the background-resistance-sweep simulated state.
Figure 11:
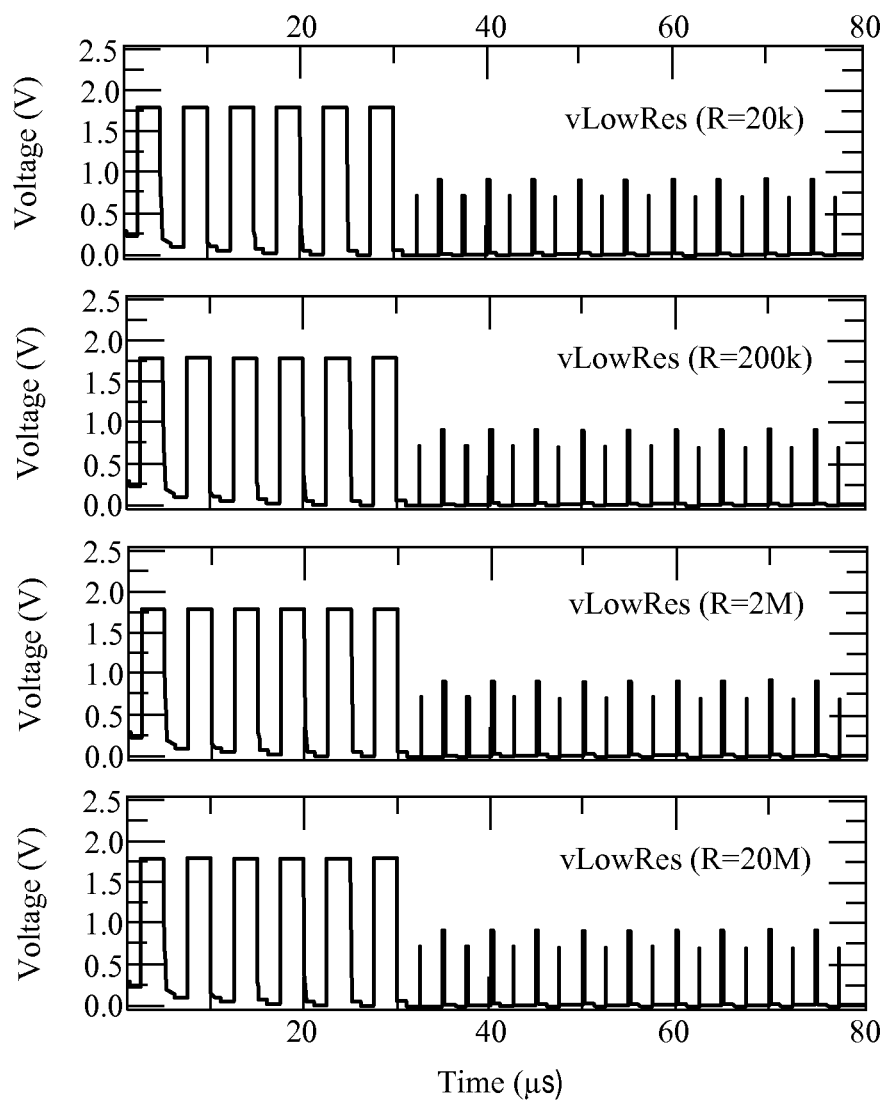
FIG. 11 is diagrams illustrating simulation results for erasing in the background-resistance-sweep simulated state.

In the background-resistance-sweep (BRS)-simulated state, the background resistance for all devices is swept from 20 kΩ to 20 MΩ. The device of interest is kept the same as in the HSS case: its resistance range is from 20 kΩ to 20 MΩ. The goal of the simulation is to show the effect of current memory state on reading, erasing, and writing to a selected memristor. FIGS. 10 and 11 show the simulation result for a broad spectrum (20 kΩ, 200 kΩ, 2 MΩ, and 20 MΩ), from top to bottom, respectively. Since tuning memristors to specific resistances is a time-consuming process, the background resistance for all devices is achieved with static resistors. FIG. 10 shows the simulation results for the write case, while FIG. 11 shows the simulation results for the erase case.

From FIG. 10, the starting resistance is about 16 MΩ, and ~21 read operations are necessary for a write. In the 20-MΩ case, one less read is required. The simulation results show only vLowRes signal for clarity (vHighRes is its opposite as shown earlier in FIGS. 8 and 9).

The BRS experiment is performed for the erase case to show that using the memristor, with proper diode isolation, a similar result is obtained. The same number of read cycles is necessary to erase the memristor in all four background-resistance sweeps.

Another concern besides the background-resistance is the effect of reading, writing, and erasing on unselected devices. A BRS experiment was performed but instead of using static devices around a memristor, the memory array was composed of all memristors with background resistances around 20, 40, and 200 kΩ. The maximum resistance for all devices still remained at 20 kΩ. FIG. 12 provides the results for the change in unselected devices during an erase operation.

In FIG. 12, the larger the minimum resistance, the larger the percent change undergone by the unselected memristors. This simulation hints that the larger the spread between the minimum and the maximum resistance, the less likely unselected memristors will change. Another factor that may contribute to the results of FIG. 12 is that the lower the minimum resistance is compared to the resistance of an OFF diode, the less likely the memristor will change. This is because of the voltage divider set up by the memristors in series with the diode whereby most of the voltage drop is on the diode thereby causing very little voltage drop on the unselected memristor.

Figure 13:
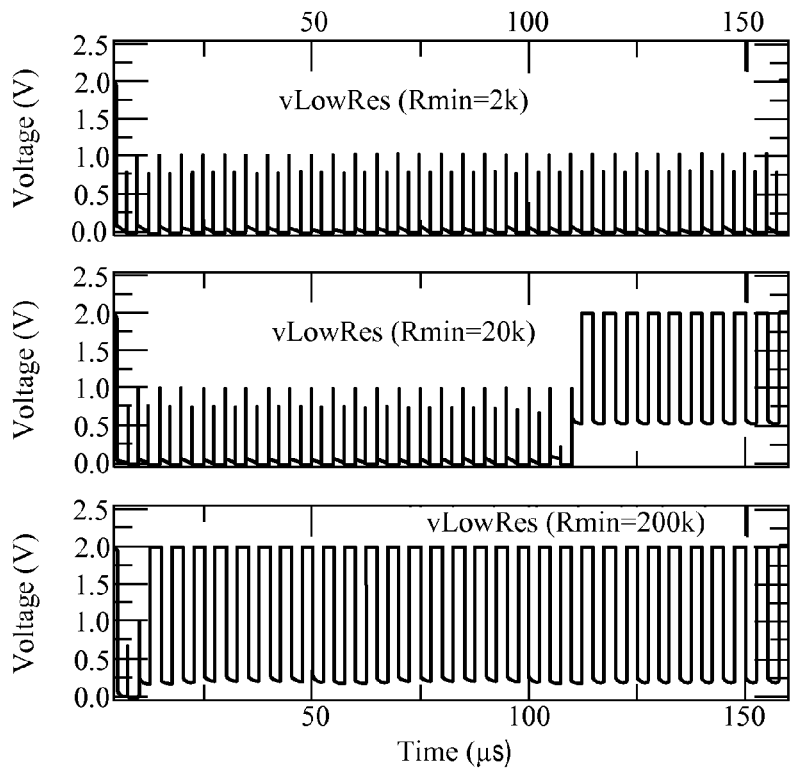
FIG. 13 is diagram illustrating simulation results for writing to resistive memory devices with varying low-resistance states.

For the minimum-resistance-sweep (MRS) case, the resistance range for the memristor of interest is modified. Since the BRS case has shown that the background resistance is really no factor with proper diode isolation, the HSS simulation conditions are used whereby unselected devices are initialized to low resistance and may change during the writing operation. FIG. 13 shows a coarse spread of low resistances and the number of read cycles necessary to complete a write. This result suggests that with the set pulse duration for sampling, there exists a continuum on the number of read cycles necessary before a write occurs. The farther the lowest resistance is from 20 MΩ, the more the number of read cycles necessary for a write to occur. In the 2-kΩ case, the switch to a low-resistive state does not occur. In the 20-kΩ case, the switch to a low-resistive state occurs after ~21 read cycles, and in the 200-kΩ case, the switch to a low-resistive state occurs after one read cycle. This trend implies that the current parameters chosen for sensing may be limited to the range currently provided. For the cases, where the low-resistive state is greater than 200 kΩ, the sensing circuit might only give vLowRes as high. The sensing resolution takes a hit here but this can be adjusted by using a shorter pulse width.

Figure 14:
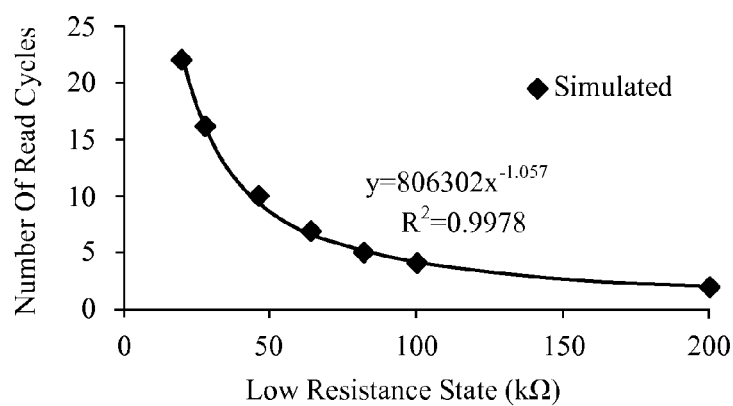
FIG. 14 is a graph depicting the number of read cycles in relation to the low-resistance state of the resistive memory device.
Figure 15A:
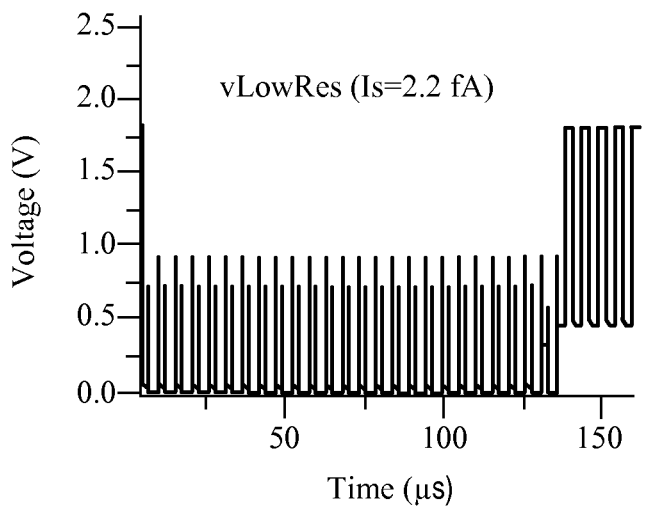
FIGS. 15A-15F are graphs illustrating simulation results for writing under different diode-leakage conditions.
Figure 15B:
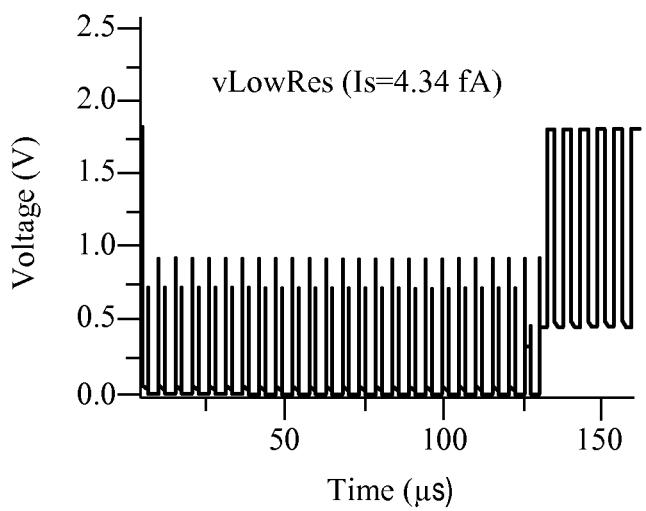
Figure 15C:
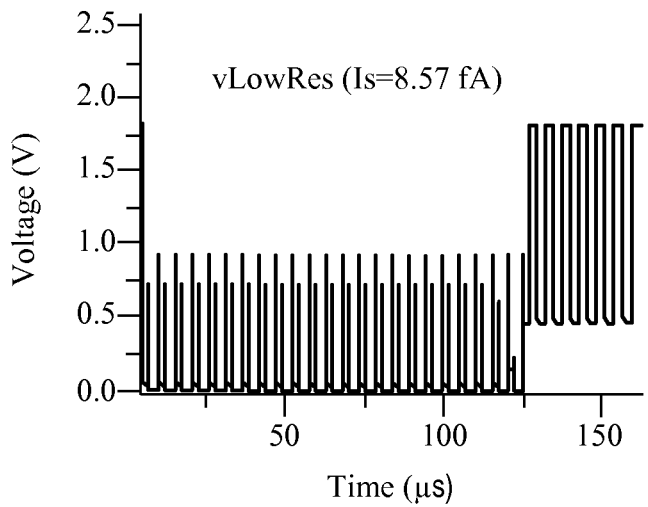
Figure 15D:
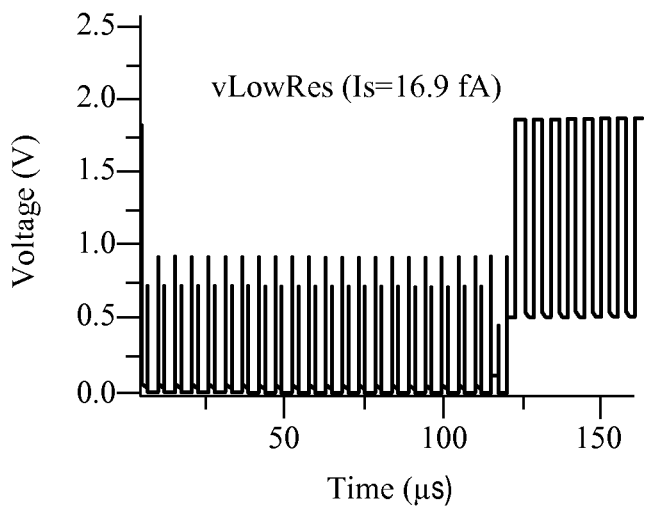
Figure 15E:
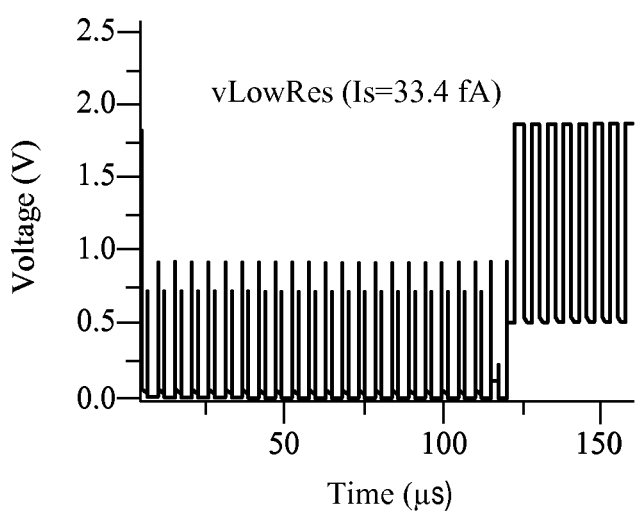
Figure 15F:
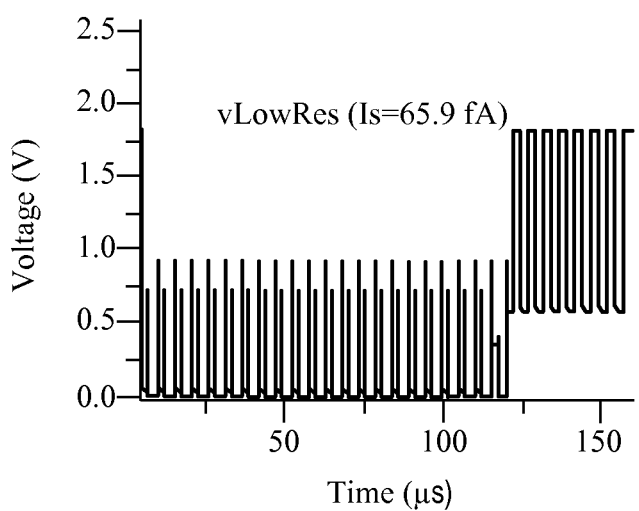
Figure 16A:
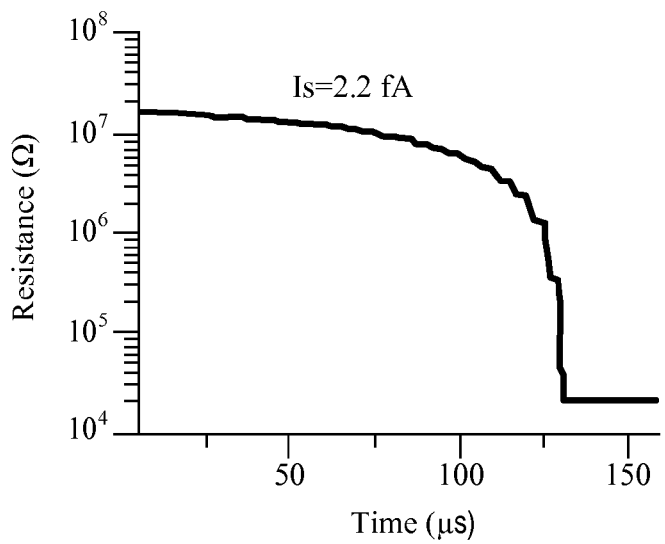
FIGS. 16A-16I are graphs illustrating simulation results for writing under different diode-leakage conditions.
Figure 16B:
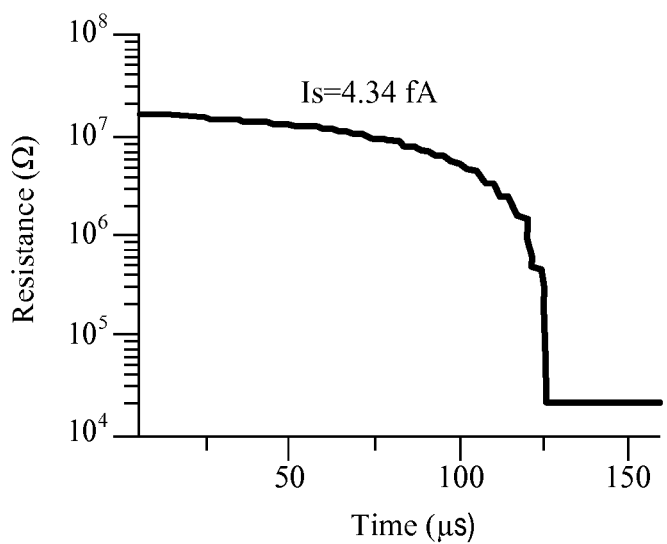
Figure 16C:
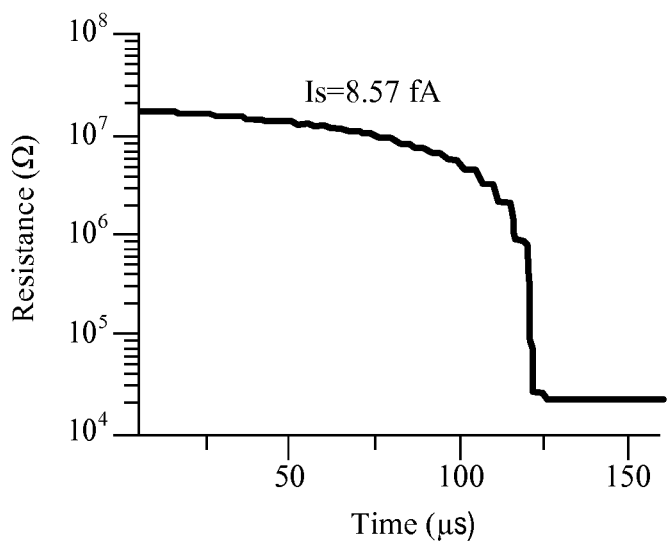
Figure 16D:
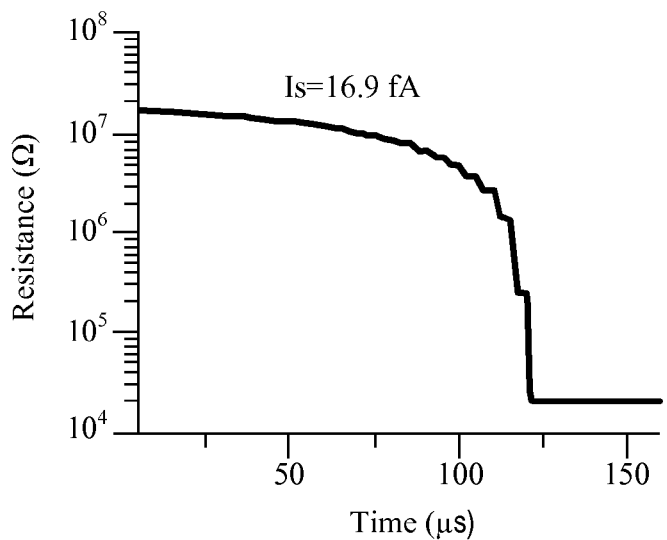
Figure 16E:
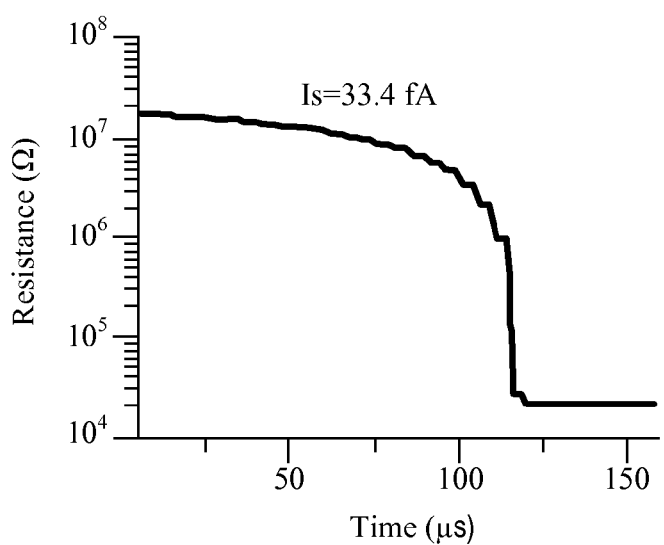
Figure 16F:
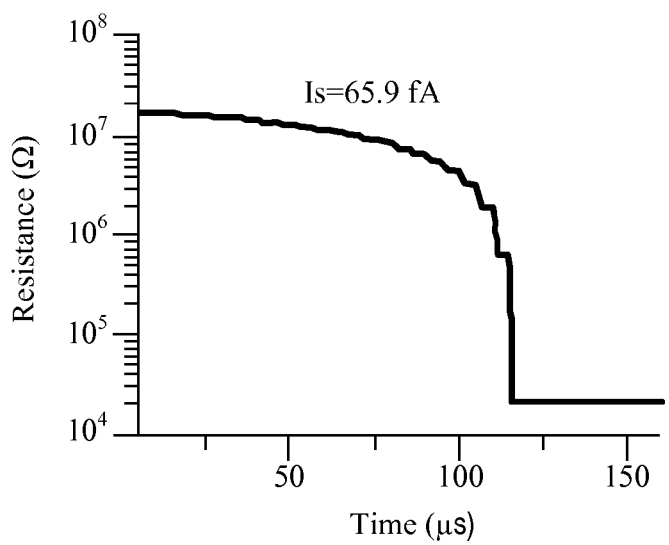
Figure 16G:
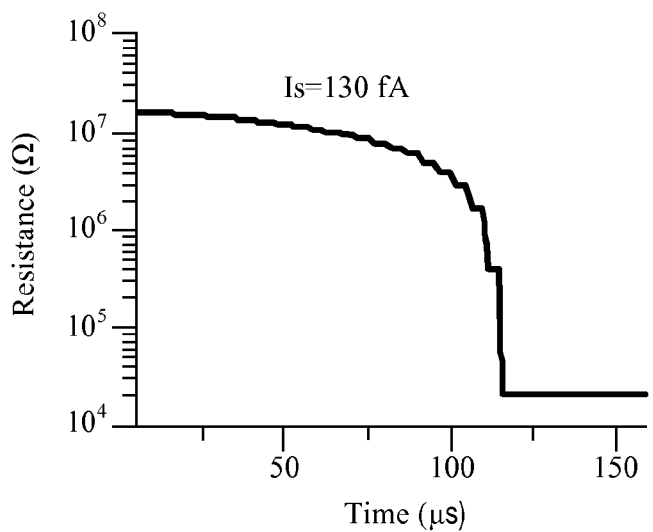
Figure 16H:
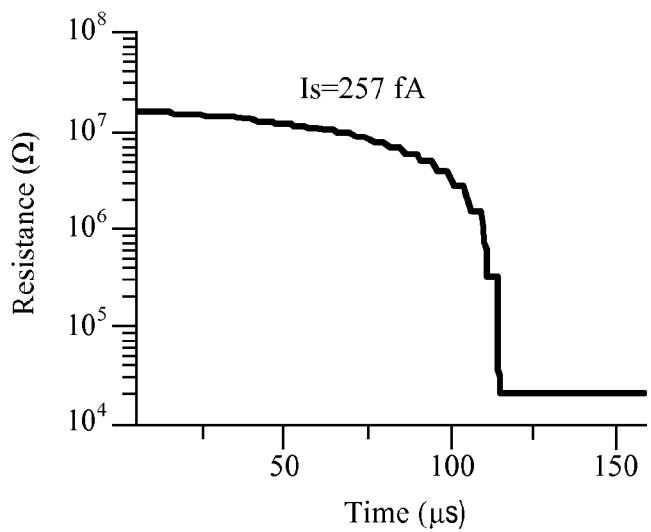
Figure 16I:
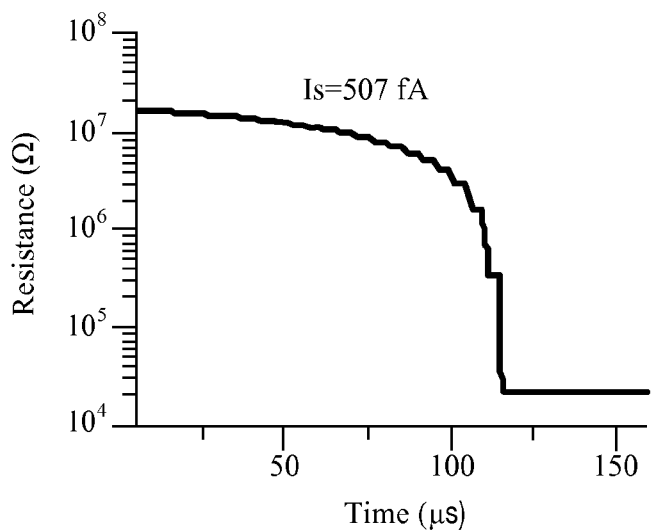

The implication of an upper end only means that for devices with low-resistance states closer to their high-resistance states, shorter sampling pulses will need to be used in order to detect the memory state. Shorter pulses will provide the resolution necessary to avoid overwriting. FIG. 13 might show a coarse sweep, but FIG. 14 shows a finer sweep of the minimum resistance. The trend mentioned earlier holds true when the low-resistance state is varied from 28 to 100 kΩ. As the low-resistance-state value increases, the number of pulses required to reach this value decreases.

The goal of diode leakage current simulation is to determine how much diode leakage the 16×16 network's sensing scheme can handle. The graphs shown in FIG. 15 depict multiple read cycles under different diode saturation currents $I_S$. The saturation currents going from left to right are: 2.2, 4.34, 8.57, 16.9, 33.4, 65.9, 130, 257, and 507 fA. For the first seven $I_S$ values, the sensing scheme works as expected. For the lowest saturation current, i.e., 2.2 fA, it takes about three more read cycles for a write to occur as opposed to the highest saturation current, i.e., 130 fA. The sensing scheme fails for the 257-fA case and 507-fA case.

In FIG. 15, the higher leakage cases actually switch the memristor device state more quickly than the lower leakage case. The failed cases (257 and 507 fA) do not signify a change in memristor characteristic behavior, but they signify a drawback in the sensing mechanism. This view is supported in the simulation results of FIG. 16. The memristor responses to the pulses provide the same general shape; therefore, the sensing method should be able to determine the resistive state. The high-leakage cases take the memristor to a low-resistive state quicker than the low-leakage cases and this is verified also in the memristance profiles. A redesign of the sensing circuit can overcome this drawback and only suggests that the circuit only responds to certain limits. By resizing the sense amplifiers, a better leakage range can be accommodated at the cost of lower precision.

Figure 17:
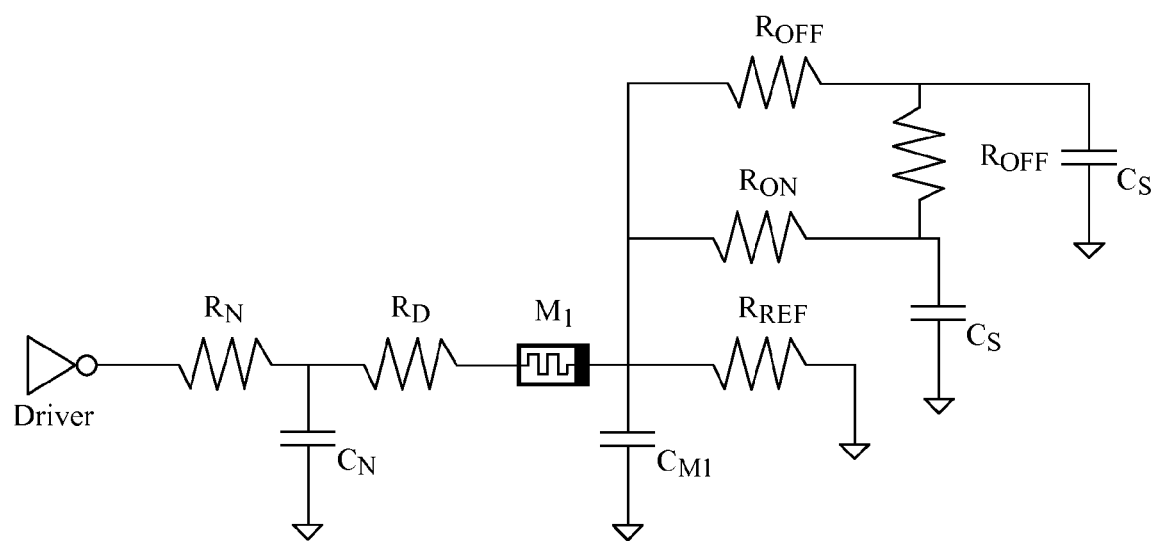
FIG. 17 is a schematic showing components considered in power analysis.

For hand analysis, a lumped wire model is used for the nanowire as shown in FIG. 17, but for simulation, a distributed pi-model is used. The capacitance $C_N$ is the femtofarad range, while $C_{M1}$ is in the attofarad range. The capacitors of interest that contribute most to the transient behavior of the chosen method are the $C_S$ capacitors that have capacitance in the hundreds of femtofarad range.

Using a Delta-Wye conversion and ignoring some capacitors, the time constants related to the OFF and ON resistance paths are derived. The small capacitors, i.e., $C_N$ and $C_{M1}$, are ignored in this analysis for sake of simplicity since they are much smaller than $C_S$. The ON and OFF paths relate to the switches in FIG. 7 that are controlled by the sampling signals, i.e., $\phi_1$ and $\phi_2$, and the EQ signal.

There are four noticeable sources of power consumption. The first comes in the form of power dissipated by the resistive nature of the nanowires, transistors, and memristors. The second comes in the form of dynamic power needed each cycle due to capacitances that charge and discharge. The third source comes from nonideal isolations and leakage, i.e., diode leakage in the nanocrossbar array or OFF transistor leakage. The last source of power comes from the static and dynamic nature of the driving circuitry used to drive the crossbar array. The third and fourth sources of power severely depend on implementation and will not be considered in the following analysis; note that with CMOS scaling, these may dominate future power consumption.

The power analysis is done for one complete read cycle, and depending on the amount of read cycles necessary for a write or an erase, the equations can be iterated through N cycles to estimate the power for the necessary number of cycles.

1) The worst-case $C_S$ charging and discharging energy: $C_S(V_{REF})^2$.

2) The worst-case energy dissipated in the resistor reference: $(I_N(M_1))^2$.

$$(R_N + M_1) \cdot t_s + \left(\frac{(V_{REF})^2}{R_{REF}}\right) \cdot t_s,$$

where $t_s$ is the average time for which the resistor combination is under bias.

During programming and erasing, the value of $M_1$ changes with the applied bias. For hand analysis and verification of the programming and erasing sequence, a model is necessary that will account for memristance change from high to low and from low to high depending on the sample voltage pulses. The change in memristance is discretized in equation (5), through N read cycles necessary for programming or erasing:

$$M_T = R_0 \sqrt{1 - \frac{2 \cdot \eta \cdot \Delta R \cdot \phi(t)}{Q_0 R_0^2}} \qquad (5)$$

$$\cong R_0 \sqrt{1 - \frac{2 \cdot \eta \cdot \Delta R \cdot \sum_{n=1}^{N} v_n \cdot t_s}{Q_0 R_0^2}}$$

The memristance varies over time following the definition of $M_T$. Here, $M_T$ is the total memristance; $R_0$ is the initial resistance of the memristor; $\eta$ is related to applied bias (+1 for positive and −1 for negative); $\Delta R$ is the memristor's resistive range (difference between the maximum and the minimum resistance); $\phi(t)$ is the total flux through the device; $Q_0$ is the charge required to pass through the memristor for the dopant boundary to move a distance comparable to the device width; and $v_n$ is the voltage across the memristor.

For programming, the adaptive method registers a change from high resistance to low resistance when the memristor hits 20 kΩ. For erasing, the change from low resistance to high resistance occurs around 4.21 MΩ. Iteratively, the power and energy is determined using constant time steps of $t_s$.

For the simulation/hand analysis, the values used are: $R_{REF}$=80 KΩ, $R_N$=26 kΩ, $C_s$=320 fF, $t_s$=2 µs, and $M_1$=18 MΩ for a high-resistive state and 20 kΩ for a low-resistive state. The $V_{DD}$ value for this simulation was chosen as 1.8V and adjusted down to 1.1 V to account for drops on the MIM diode. With these parameters, the power consumed for each read cycle in the low-resistive state is 9.68 µW, while the power consumed in the high-resistive state is 0.07 µW.

For the SPICE simulated case, the power consumed for each read cycle in the low-resistive state is 10.5 µW, while the power consumed in the low-resistive state was 0.67 µW. The values for the low-resistive state are similar to the calculated but the value for the high-resistive state is a great underestimation (89.6% error)!

The high-resistive state is definitely a victim to the leakage power. The simulation in this study is done in a low-resistive memory state to account for the worst-case condition. In this memory state, the measured leakage value for device in the selected rows and selected columns is around 20 nA each. In our 16×16 array, this accounts for 30 devices biased to around 0.9 V (lower than the MIM diode threshold); therefore, the leakage increases due to the applied bias. The diodes are modeled with two P-N diodes in series for the worst-case performance, while the actual MIM characteristics will be better.

In order to estimate the energy more efficiently, this leakage power must be accounted for. This was done by using the diode equation in J. J. Yang et al's "Memristive switching mechanism for metal/oxide/metal nanodevices", Nature Nanotechnology, vol. 3, no. 7 (2008), with $I_0$=2.2 fA, kT/q=25.85 mV, $V_D$=0.45 V (0.9 V divided equally by two identical P-N diodes) and n=1.08, $I_{Diode}$=22 nA. Assuming each path on the selected rows and columns takes a diode current of this magnitude; then, the total power consumed by leakage in the 16×16 array is 30×22 nA×0.9 V=0.59 µW. Adding this value to the hand-calculated values shown earlier gives better agreement with the simulation in both resistive states: 10.27 and 0.66 µW.

TABLE I

Power and Energy Summary

|  | Calculated | Simulated | % Error |
|---|---|---|---|
| Power (µW) | | | |
| Read high resistance | 0.66 µW | 0.67 µW | −1.49 |
| Read low resistance | 10.27 µW | 10.5 µW | −2.19 |
| Program* | 23.83 µW | 35.9 µW | −33.62 |
| Erase** | 13.21 µW | 15.3 µW | −13.7 |
| Energy per bit (pJ/bit)*** | | | |
| Read high resistance | 1.32 | 1.34 | −1.49 |
| Read low resistance | 20.55 | 21 | −2.14 |
| Program* | 47.67 | 71.8 | −33.62 |
| Erase** | 26.41 | 30.6 | −13.7 |

*Twenty six read cycles necessary for a write in the simulation, while this number is loss in hand calculation.
**Calculated changed to match number of cycles necessary to exceed 4.21 MΩ and not the number of cycles necessary to erase device to ~20 MΩ
***2 µs total pulsel width used for each read cycle.

To summarize, the energy per bit for the memristor memory compared to flash looks very promising. The numbers from flash include the periphery circuitry and driving circuitry. Most energy consumption in flash is usually attributed to the charge pumps, which are unnecessary in the resistive memory case. In flash memory products comparison, the lowest read energy for single-level cells is 5.6 pJ/bit, program energy 410 pJ/bit, and erase energy 25 pJ/bit. These values are from different single-level cells (one product could not boast to be the lowest in all categories). The read and erase energy per bit for the resistive memory is given in Table I. There is a potential of reducing the program energy significantly by shifting to resistive memory technology. The erase energy between this technology and flash are similar, and the read energy depends on the state of the memristor being read.

The resistive RAM (RRAM) is a structure that strives on the isolation provided from one cell to the next cell. The ability to selectively access one device without disturbing the other is the most vital trait of the technology. The results from the diode leakage current (DLC) simulation show the vulnerability of sensing in the resistive memory when the leakage current is too high. One way to combat this effect is to allow for an adjustable reference resistor and design for specific leakage tolerance. The BRS results showed that as long as the diode isolation was intact, the memory state does not dominate device-state sensing. In essence, the proposition of more tolerable sensing methods does not eliminate the need for tighter device processes with respect to isolation.

The method proposed provides a sensible way to deal with errors (defects) in the crossbar structure. Errors can be classified in three ways: 1) the memristor is in a stuck-open state; 2) the memristor is in a stuck-closed state; and 3) the lower bound or upper bound resistance targets are not met. In the first two errors (stuck open or stuck closed), an attempt to write the opposite data to the memristor will fail. In either case, as long as the memristor is static, the write methodology will only attempt the write process once. The read process will always produce a Logic 1 as defined in the flow diagram in FIG. 4A. The stuck-open or stuck-closed case will not take multiple write cycles in order to determine if the memristor is functional. To determine if the device works or not, a read in one direction is performed, an opposite data write is tried (again lasting only one read cycle due to the static nature of the failed device), and a read verify is performed. If both reads yield the same result, then the device is nonoperational. This method removes the guesswork from setting hard thresholds and setting the maximum write tries before a memory-storage cell is deemed defective.

The defective nature of a stuck-open or stuck-closed cell is different from a device that misses the target high and low resistances for memristor devices. These devices behave in a way that exhibit hysteresis but may have larger or smaller ratios of the resistance in the high state to the resistance in the low state compared to the design target. Since the proposed method does not deal directly with the absolute resistance values, the exact extremes of the resistance of a certain device is not of interest. Resistance extremes are dealt with in ratio (see FIG. 13). The larger the range between the high- and low-resistive states, the more the number of read cycles necessary to perform a write or erase operation. Also, depending on resistance range, the pulse widths used for the design may not be enough to distinguish high and low states. For example, in FIG. 13, any low level greater than 200 kΩ does not provide enough separation between the high- and low-resistive states. The chosen 1-µs pulse widths would already change the device state from one extreme to another during a read operation. The analyses done in this study examines the memory limitations for a chosen pulse width, but the values presented can be improved upon with shorter pulses (<1 µs) based on the improved memristor switching performance.

The advantage of using this method for read/write is to combat the effects of process variation within the crossbar structure. The exact low level does not matter except that the level is within operational limits imposed by the 1-µs pulse. The nature of the low level and high levels of memristive devices to change during operation requires that the sensing method take this into account. During operation, as long as the pulses do not change the memristor device to an extreme, then a device that may have been deemed a failed device under another sensing scheme is salvaged for further use. This method provides an insightful scheme to combat the effects of resistance drift as memristors' absolute extreme resistances change over their lifetimes.

The power and energy numbers in Table I show some disagreement between calculated and simulated values. Eliminating the assumptions made due to the low time constant values for the different capacitor paths may help agreement. Essentially, the storage capacitors, although their access transistors are in the OFF state, are leaking and charging depending on the cycle presented by data. Also, the peripheral circuitry consumes power not included in the calculated values. Considering that the same driving circuitry is used to drive the memristor in both its high- and low-resistive states, the low current achieved in the high-resistive state suggests that the time constants of the OFF and the ON paths have similar power characteristics, which accounts for 0.01 µW. However, in the low-resistance state, the OFF and ON paths have differing power profiles leading to 0.23 µW disagreement between simulated and calculated.

The program and erase numbers have a larger error differential because two different modes are used to determine the weight change in the memristor. In the calculated case, the weight change is determined through an approximated linear diffusion model whereby boundary effects are not taken into consideration. In the simulated model, boundary effects are modeled with a window function, which is why when the device is in a low-resistive state at a boundary albeit high current, the memristance does not change as drastically as predicted by the linear model.

The proposed method takes into account problems that may be more pronounced in the higher dimension grid, i.e., 4-KB block size as used in many commercial flash devices. The resistive nature of the nanowire will be more pronounced for devices not very close to the driver. This method of determining memory state adjusts to the resistive drops that may be made when the nanowires are more resistive than expected. The problem that may affect a larger memory size is excessive voltage drops, which would require tuning the voltage level to accommodate all devices in the crossbar array. Devices far from the drivers will essentially take longer to write or erase compared to devices closer to the driver. Essentially, an adaptive read, write, and erase method allows for a more flexible process technology and will enable the adoption of the memristor memory sooner since devices that do not meet high- and low-resistance criteria may still be used with confidence.

The showcased memristor memory extols the advantages of using the new technology in memory applications. The method of achieving the read, write, and erase relate adaptively to each memristor device thereby allowing for the increased yield when it comes to using devices that have differing high to low resistance range. The memristor memory also exhibits lower power and energy consumption when compared to flash memory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An adaptive method for reading a resistive memory, comprising:
    applying a first sample pulse of voltage to a terminal of a resistive memory cell;
    measuring a first resistance of the resistive memory cell, where the measuring takes place in response to the first sample pulse;
    applying a second sample pulse of voltage to the terminal of the resistive memory cell;
    measuring a second resistance of the resistive memory cell, where the measuring takes place in response to the second sample pulse;
    determining a difference between the first resistance and the second resistance;
    determining a logic state of the resistive memory cell from the difference; and
    applying a correction pulse of voltage to the resistive memory cell, the correction pulse having a polarity opposite the sample pulse.

2. The method of claim 1 wherein applying the correction pulse to the resistive memory cell occurs only when the determined logic state corresponds to a high resistance state of the resistive memory cell.

3. The method of claim 1 wherein determining a difference between the first resistance and the second resistance further comprises determining a slope between the first resistance and the second resistance.

4. The method of claim 1 wherein determining a difference between the first resistance and the second resistance uses an unbalanced sense amplifier circuit.

5. The method of claim 1 wherein the resistive memory cell is further defined as a memristor.

6. The method of claim 1 wherein the resistive memory cell is arranged in a crossbar memory structure.

7. An adaptive method for reading a resistive memory, comprising:
    applying a sample pulse of voltage to a terminal of a resistive memory cell;
    measuring a resistance of the resistive memory cell, where the measuring takes place in response to the sample pulse;
    applying a second sample pulse of voltage to the terminal of the resistive memory cell;
    measuring a second resistance of the resistive memory cell, where the measuring takes place in response to the second sample pulse;
    determining a difference between the resistance measure and the second resistance measure;
    determining a logic state of the resistive memory cell from the difference; and
    applying a correction pulse of voltage to the terminal of the resistive memory cell, the correction pulse having a polarity opposite the sample pulse.

8. The method of claim 7 wherein applying the correction pulse to the resistive memory cell occurs only when the determined logic state corresponds to a high resistance state of the resistive memory cell.

9. The method of claim 7 wherein determining a difference between the first resistance and the second resistance uses an unbalanced sense amplifier circuit.

10. The method of claim 7 wherein the resistive memory cell is further defined as a memristor.

11. The method of claim 7 wherein the resistive memory cell is arranged in a crossbar memory structure.

12. An adaptive method for programming a resistive memory, comprising:
  determining a resistive state of a resistive memory cell;
  a) applying a first sample pulse of voltage to a terminal of the resistive memory cell;
  b) measuring a first resistance of the resistive memory cell, where the measuring takes place in response to the first sample pulse;
  c) applying a second sample pulse of voltage to the terminal of the resistive memory cell, where polarity of the first sample pulse and the second sample pulse is set in accordance with the determined resistive state of the resistive memory cell;
  d) measuring a second resistance of the resistive memory cell, where the measuring takes place in response to the second sample pulse;
  e) determining a difference between the first resistance and the second resistance; and
  repeating steps (a)-(e) until the difference is less than a threshold;
wherein determining a resistive state of a resistive memory cell further includes applying a first sample pulse of voltage to a terminal of the resistive memory cell;
  measuring a first resistance of the resistive memory cell, where the measuring takes place in response to the first sample pulse;
  applying a second sample pulse of voltage to the terminal of the resistive memory cell;
  measuring a second resistance of the resistive memory cell, where the measuring takes place in response to the second sample pulse;
    determining a difference between the first resistance and the second resistance;
    determining a logic state of the resistive memory cell from the difference; and
    applying a correction pulse of voltage to the resistive memory cell when the determined logic state corresponds to a high resistance state of the resistive memory cell, the correction pulse having a polarity opposite the sample pulse.

13. The method of claim 12 further comprises setting polarity of the voltage for the first and second sample pulses when the resistive memory cell is in a high resistive state and setting the voltage of the first and second sample pulses to an opposite polarity when the resistive memory cell is in a low resistive state.

14. The method of claim 12 further comprises determining a resistive state of a resistive memory cell by a applying a bias voltage to the resistive memory cell, where magnitude of the bias voltage is substantially the same as magnitude of the first and second sample pulses.

15. The method of claim 12 wherein the resistive memory cell is further defined as a memristor.

16. The method of claim 12 wherein the resistive memory cell is arranged in a crossbar memory structure.

\* \* \* \* \*